United States Patent [19]

Halemane et al.

[11] Patent Number: 4,918,396
[45] Date of Patent: Apr. 17, 1990

[54] MONITORING AND/OR CONTROL OF OPTICAL AMPLIFIERS

[75] Inventors: Thirumala R. Halemane, Howell; Bartley C. Johnson, Cranbury; Robert M. Jopson, Rumson, all of N.J.

[73] Assignee: AT&T Bell Laboratories, Murray Hill, N.J.

[21] Appl. No.: 333,218

[22] Filed: Apr. 5, 1989

[51] Int. Cl.⁴ .............................. H01S 3/13; H04B 9/00
[52] U.S. Cl. ...................................... 330/4.3; 455/613; 372/31
[58] Field of Search ........................ 330/4.3; 332/7.51; 455/613; 372/31

[56] References Cited

PUBLICATIONS

"A Novel All Electrical Scheme for Laser Amplifier Gain Control", European Conference on Optical Communications, Jul. 1988.

Primary Examiner—Nelson Moskowitz
Attorney, Agent, or Firm—Eli Weiss

[57] ABSTRACT

Briefly, in this invention, the output optical power of an optical amplifier is determined by detecting and measuring the electrical signal induced on the bias lead of the optical amplifier when an optical data stream with additional amplitude modulation passes through the optical amplifier. This additional amplitude modulation can consist of a base band signal, a pilot tone and/or a subcarrier which is amplitude modulated, frequency modulated or phase modulated. The modulation depth and bandwidth of the additional amplitude modulation should be kept small enough that the data stream is not excessively affected. The induced electrical signal provides a measurement of the optical power at the output facet of the optical amplifier. Control of the output power of the optical amplifier is effected by controlling the bias current applied to the bias lead of the optical amplifier. Thus, the output power of an optical amplifier can be monitored and telemetry signals can be received without interception of the data stream. The additional amplitude modulation of the data stream can be effected at the transmitter or by modulation of the bias current of an optical amplifier for transmission downstream. With this invention, no optical power is lost when the output power generated by an optical amplifier is monitored and modulation of the data stream can be effected without the use of additional optical components.

5 Claims, 2 Drawing Sheets

MONITORING AND/OR CONTROL OF OPTICAL AMPLIFIERS

TECHNICAL FIELD

The invention relates generally to semiconductor optical amplifiers and more particularly to monitoring and/or controlling an optical amplifier.

BACKGROUND OF THE INVENTION

Today's long haul communication systems are hybrids of optical and electronic components. For example, the repeaters detect light photoelectrically, amplify the resulting current electronically and then use the amplified current to drive a semiconductor laser which again converts the electrical signal back into an optical signal. The optical signal is then carried in an optical fiber to the next repeater in the system where the conversion from optical-to-electrical and back again to optical is repeated again.

In an all-optical transmission system, light, once generated, will be transmitted optically, amplified optically, and received by direct optical detection. There is no intermediate conversion from optical to electrical and then back to optical form. Direct optical amplification of an optical signal which results in the elimination of the electronic processing will enable optical communication system to have repeaters which have higher bandwidths, are physically smaller, simpler in design, more efficient to operate and more economical to produce.

Their performance is relatively unaffected by changes in the data bit rate and by the presence of additional channels are separate wavelengths, thus allowing for the possibility of upgrading an installed system to a higher capacity by changing only the equipment at the terminals.

Currently, research and development on semiconductor optical amplifiers is aimed at eliminating many of the optical-to-electrical and electrical-to-optical conversions which are currently required in optical communication systems.

One area which can present a problem is that of determining and/or controlling the output power of an optical amplifier. This is necessary because the gain of optical amplifiers can be affected by both environmental effects (i.e., changes in ambient temperature) and variations in system variables (i.e., changes in source wavelength and the polarization of the input signal). Another area of concern, when using optical amplifiers at repeater sites of optical communication systems is that of being able to send telemetry command signals to the optical amplifiers and having the optical amplifiers detect the telemetry command signals.

Currently, the power output of an optical amplifier is determined by diverting a portion of the generated optical power by means of an optical coupler and directing the diverted power to an optical detector/receiver. A primary disadvantage of this method is that a portion of the optical power generated by the optical amplifier is lost by the monitoring process.

SUMMARY OF THE INVENTION

Briefly, in this invention, the output optical power of an optical amplifier is determined by detecting and measuring the electrical signal induced on the bias lead of the optical amplifier when an optical data stream with additional amplitude modulation passes through the optical amplifier. This additional amplitude modulation can consist of a base band signal, a pilot tone and/or a sub-carrier which is amplitude modulated, frequency modulated or phase modulated. The modulation depth and bandwidth of the additional amplitude modulation should be kept small enough that the data stream is not excessively affected. The induced electrical signal provides a measurement of the optical power at the output facet of the optical amplifier. Control of the output power of the optical amplifier is effected by controlling the bias current applied to the bias lead of the optical amplifier. Thus, the output power of an optical amplifier can be monitored and telemetry signals can be received without interception of the data stream. The additional amplitude modulation of the data stream can be effected at the transmitter or by modulation of the bias current of an optical amplifier for transmission downstream. With this invention, no optical power is lost when the output power generated by an optical amplifier is monitored and modulation of the data stream can be effected without the use of additional optical components.

Detailed Description

Figure 1:
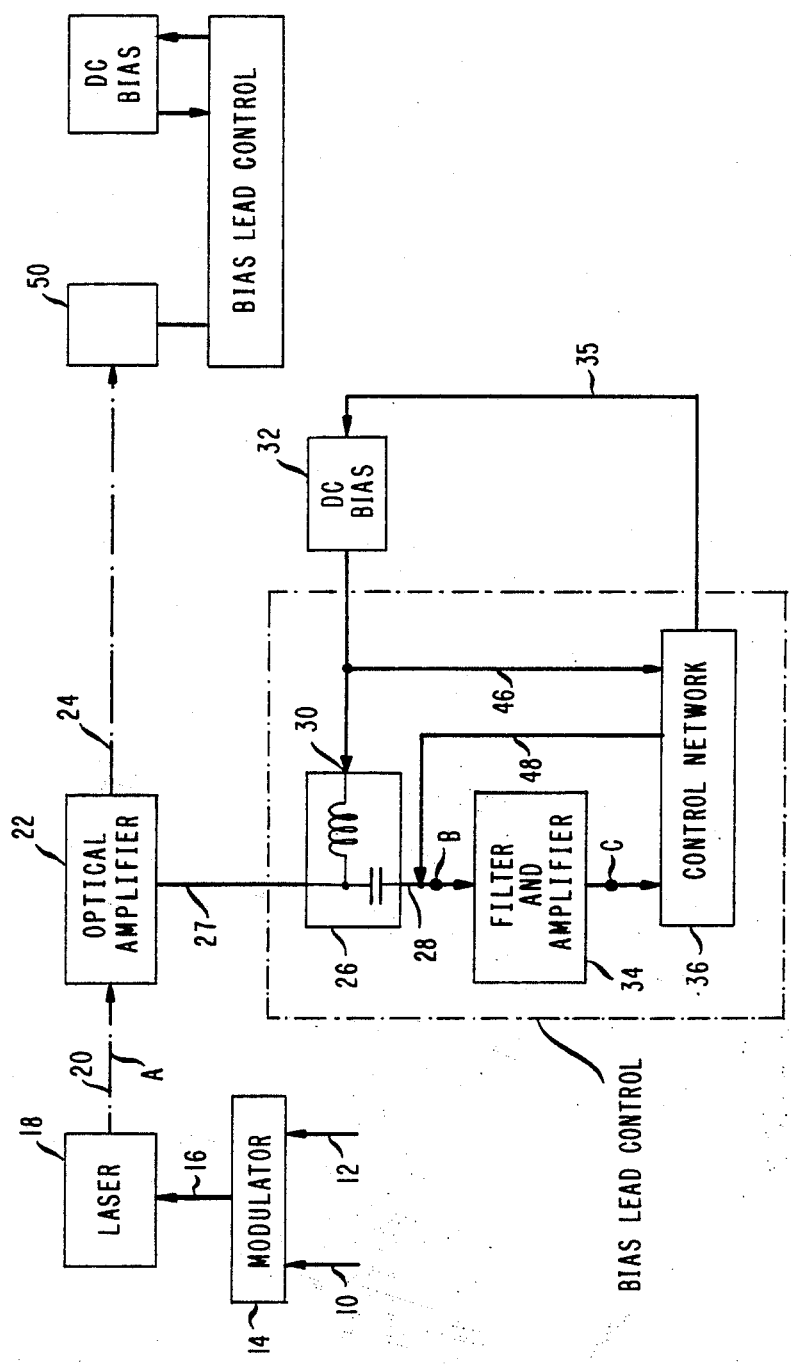
FIG. 1 is a schematic of structure in accordance with the principles of the invention for detecting a signal induced on the bias lead of an optical amplifier for detecting and/or transmitting telemetry signals and/or adjusting the power output of the optical amplifier.

The power output of an optical amplifier can be monitored and telemetry signals received during operation, by detecting and measuring the signal induced on the bias lead of the optical amplifier when a lightwave data stream with additional amplitude modulation passes through the optical amplifier. This additional amplitude modulation can consist of a base band signal, a pilot tone and/or a sub-carrier which is amplitude modulated, frequency modulated or phase modulated. The output power of an optical amplifier can be monitored and telemetry signals can be received without interruption of the data stream. The additional amplitude modulation of the data stream can be effected at the transmitter or by modulation of the bias current of an optical amplifier for transmission downstream. Furthermore, additional telemetry signals can be placed on the data stream by modulation of the bias current of the optical amplifier.

Briefly, a semiconductor optical amplifier can have a structure which is similar to that of a semiconductor laser. In each instance, the structure can be that of a semiconductor diode and its mode of operation is determined by the value of the bias current through the diode. More specifically, if the current which is applied to the diode is relatively low, the active region of the semiconductor diode will glow with light which is emitted spontaneously over a relatively broad spectrum of wavelengths. Light which enters the device from an external source is absorbed. In this mode, the semiconductor diode operates as a light emitting diode.

If the current which is applied to the semiconductor diode is increased slowly, at some value the diode will become transparent to received optical radiation. Thus, light which enters one end of the semiconductor diode will pass through and be emitted from the other end of the semiconductor diode. There is no net absorption of the light. This magnitude of current is called the transparency current. At currents above the transparency current, the semiconductor diode operates as an amplifier. If the value of the current is increased further, the semiconductor diode has a net gain and incident light is intensified or amplified. Further increases in current result in further increases in amplification and in general, the optical gain of the amplifier is an exponential function of the bias current. When the semiconductor is operating in this mode, it spontaneously emits its own light intensity and amplifies that light.

A still further increase in the value of the current to the semiconductor diode will, at some point, cause saturation. Saturation is a deviation of the gain-current relationship from the previously established exponential relationship. Saturation can be caused by many effects including thermally induced reduction in the diode gain, free-carrier absorption, or Auger recombination; however, in a properly designed diode, saturation first appears as a reduction in the gain of the amplifier caused by a loss of carriers from stimulated emission induced by the spontaneously emitted light. If, however, the semiconductor diode is provided with partially reflective end mirrors, the gain will saturate at a current which is less than the saturation current for the case of no mirrors. At this current, the threshold current for lasering operation, the light will resonate back and forth between the two partially reflective end mirrors to stimulate further emission with each pass and, during this process, some of the optical power will pass through the end mirrors as laser light.

Thus, depending on the value of the current which is applied, and upon the reflectivities of the end mirrors or facets, the semiconductor diode will operate as a light emitting diode, an optical amplifier or a laser.

Semiconductor optical amplifiers are often categorized into two classes, one being the Fabry-Perot optical amplifier and the other being the Traveling-Wave optical amplifier. The distinction is a matter of convenience with the term "Fabry-Perot" referring to an amplifier that is operating near the lasing threshold current and the term "Traveling-Wave" referring to amplifiers operating with a current far below the lasing threshold current. Optical amplifiers operate in a region between these two extremes and henceforth the term "optical amplifier" refers to both types.

In semiconductor optical amplifiers, the gain (the ratio of the output power divided by the input power) is related to the value of the injection current, the reflectivity of the mirrors, the distance between the mirrors and the like. The gain is also dependent on the length of the device and increases as the magnitude of the injection current is increased. More specifically, for a single pass, the gain in an unsaturated optical amplifier increase exponentially as the length of the device is increased or the injection current is increased.

Various conditions affect the gain of a semiconductor optical amplifier. Once condition is known as gain saturation. When the gain of a semiconductor optical amplifier is saturated, a further increase in the input signal does not result in a proportional increase in output signal.

Referring to FIG. 1, there is illustrated a schematic of structure in accordance with the principles of the invention for monitoring the optical power output of a semiconductor optical amplifier which can be in an optical communication system. Using the signal induced on the bias lead, the power output of the optical amplifier can be automatically adjusted to stay within present limits. In addition, if a telemetry signal is optically transmitted to the optical amplifier by amplitude modulation of the data stream, the electrical signal induced on the bias lead will be the telemetry signal. A data bit stream signal which can be in electrical form is applied to a terminal 10 of a modulator 14. The data bit stream can comprise pulse signals to represent the various "1" and "0"s which are normally present to represent information and can have a bit rate which may extend from below 100 Kbits/sec. to 32 Gigbits/sec or higher. An additional modulation signal also in electrical form, is applied to terminal 12 of the modulator 14. This additional modulation signal, the telemetry signal, will amplitude modulate the data stream at frequencies much slower than the data bit stream. This telemetry signal can comprise a base band signal, pilot tone or frequency modulated, phase modulated or amplitude modulated sub-carrier. The pilot tone signal can be a sine wave approximately 1/10,000 that of the data bit stream rate. Modulation of the pilot tone signal will permit the transmission and detection of telemetry data. The pilot signal is combined with the data bit stream in the modulator 14, and the resulting signal is applied, via conductor 16, to a laser 18 which converts the received electrical signals into optical signals. The optical signals from the laser 18 are launched onto optical fiber 20 which terminates at an input terminal of optical amplifier 22. The optical signals on optical fiber 20 are amplified in optical amplifier 22 and then retransmitted via optical fiber 24 to the next optical amplifier or to an optical receiver. It is to be noted that the amplification and transmission of the optical signals does not require any conversion to an electrical signal. The optical signals are amplified and transmitted entirely in optical form.

The optical amplifier 22 can be any type of semiconductor optical amplifier which has a bias lead to control the gain of the optical amplifier and, therefore, controls the power output of the optical amplifier. A bias tee 26, which can comprise an inductor and a capacitor, provides an AC path 28 and a DC path 30 to the bias lead 27 of the optical amplifier. An electrically controlled DC bias current source 32, is coupled to DC path 30 to provide bias current to the bias lead of optical amplifier 22. AC path 28 couples signal variations which are present on the bias lead 27 to a filter and amplifier network 34. The filter, which can be at the front end of the filter and amplifier network 34, filters out the higher frequency data stream signals in the induced signal. The lower frequency telemetry signals are passed by the filter, are amplified, and are directed to a control network 36. The control network 36 is adapted to receive: telemetry information and/or pilot tones from a filter network, measure the DC bias current applied to the bias lead of the amplifier, transmit telemetry information to the bias lead, and/or control of the DC bias. The signals passed by the filter are referred to as the telemetry signals. Network 36 is also coupled to measure the level of the bias current generated by DC Bias network 32 and coupled through the bias tee 26 to the bias lead of the optical amplifier. Network 36 is also adapted to measure a specific characteristic of the telemetry signal from the filter and amplifier unit 34, such as, for example, the amplitude of a pilot tone. Based upon the value of the characteristic and the value of the signal from the DC Bias network 32, control network 36 determines or monitors the output optical power of the optical amplifier and generates an appropriate signal to control the DC bias network 32. More specifically, if the power output of the optical amplifier is to be increased, the network 36 sends a signal to the bias network 32 which causes an increase of the bias current.

In a similar manner, if the power output of the optical amplifier is too high, the signal from the network 36 to the DC bias network 32 will cause a decrease of a bias current. Naturally, if the optical amplifier is operating at its desired output power, the the signal on lead 35 will not cause the value of the bias signal to change. Thus, it can be stated that the bias tee, the filter and amplifier network and the control network comprise a bias lead network for the semiconductor optical amplifier. If, the signal induced on the bias lead is the result of a telemetry signal on the data bit stream, then the signal generated by network 36 will cause the bias signal to be modulated in a manner representative of the detected telemetry signal. If desired, the telemetry information can have a specific coding (i.e., frequency, time slot and the like) which can be separated from other non-telemetry detected signals at location "B" or "C" for transmission to a desired location.

Figure 2:
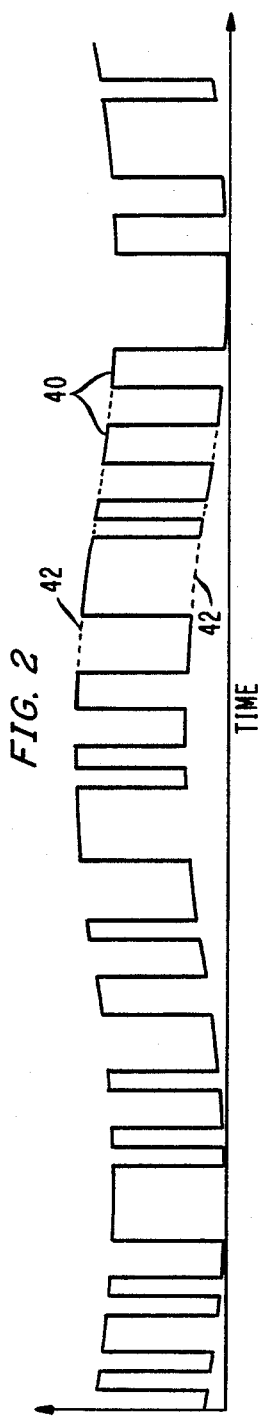
FIG. 2 is an illustration of a plot of signal transmitted on the optical fiber to the optical amplifier.

A typical plot of the signal on optical fiber 20 which is received by the optical amplifier 22 is illustrated in FIG. 2. The plot of FIG. 2 is typical of optical power in optical fiber 20 at point A relative to time. The narrow vertically-oriented pulses 40 can be optical "1" signals of the data pulse stream signal applied to terminal 10 of modulator 14. The spaces between the "1's" can designate "0's". The variations in the envelope 42, identified by the dotted line which is at a lower frequency than that of the data pulse stream, is the result of the additional modulation (telemetry signal) applied to terminal 12 of modulator 14.

The optical signal illustrated in FIG. 2, which comprises the optical data stream and the telemetry signal, is amplified by optical amplifier 22 and then coupled into optical fiber 24. During the amplification of the optical signal, a similar signal, in electrical form, is induced on bias lead 27 of the optical amplifier 22. The AC portion of the induced signal on lead 27 is blocked by the bias tee 26 from reaching the DC bias network 32. But, it is passed by bias tee along the path 28 to an input port of the filter and amplifier network 34.

Figure 3:
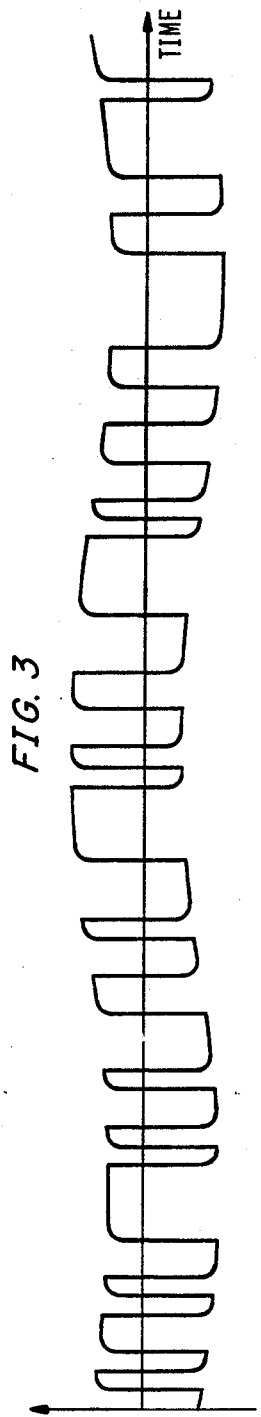
FIG. 3 is an illustration of a plot of the signal induced on the bias lead of the optical amplifier and which is passed through a bias tee network.

FIG. 3 is a plot of the induced signal after it has passed through the bias tee and is directed to an input port of filter and amplifier network 34. It is to be noted that the signal is centered about the zero axis because of the effect of the bias tee amplifier.

Figure 4:
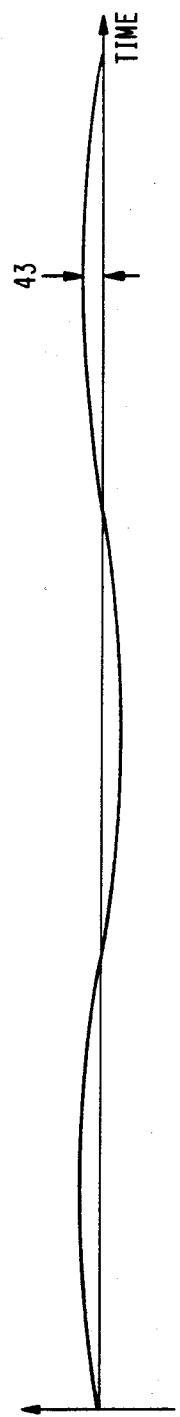
FIG. 4 is an illustration of a plot of the signal of FIG. 3 after it has passed through a filter network.

FIG. 4 is a plot of the signal illustrated in FIG. 3 after it has passed through the filter and amplifier network 34. In network 34, the filter sectio, blocks the higher frequency data pulse stream and passes the lower frequency telemetry signal 42. This signal can then be amplified. The amplified telemetry signal is directed to an input port of control network 36 where it is demultiplexed, for example, into the various telemetry information channels and pilot tones.

The amplitude of a pilot tone signal is related to the output power of the optical amplifier. More specifically, a decrease in the amplitude of the pilot signal indicates the the output power of the optical amplifier is less than desired; and, an increase in the amplitude of the pilot signal indicates that the output power of the optical amplifier is greater than desired. An output signal on line 35 from the control network 36 is directed to the DC bias network 32 to adjust the DC bias signal fed through the bias 26 to the bias lead 27 of the optical amplifier to provide a substantially constant output power to control the gain of the optical amplifier. There are circumstances where the proportionality constant between the output power generated by the optical amplifier and the amplitude 43 of the pilot tone depends on the DC bias current applied to the bias lead of the optical amplifier. Thus, to compensate for the varying effect the DC bias signal has on the operation of the optical amplifier, the control network can also be coupled, via lead 46, to receive and measure the DC bias signal which is currently being applied to the bias lead of the optical amplifier. In this instance, both the value of the pilot tone signal and the value of the DC bias signal are used to determine the value of the DC bias that should be applied to the bias lead to keep the optical amplifier operating at a substantially constant power output.

In the embodiment described above, the amplitude of the pilot tone was used to control the output power of the optical amplifier. In other situations it may be desirable to use the amplitude of a telemetry channel instead of the amplitude of the pilot tone to control the output power of the optical amplifier. When the invention is used for telemetry, demultiplexed telemetry channels which are detected are received by control network 36 and the resultant information, is sent to an appropriate location (i.e., voice to a telephone, etc.) which is to be transmitted downstream can be multiplexed into a telemetry signal which is applied through conductor 48 to AC path 28 and thence to bias 27.

In some instances, it may be desirable to transmit telemetry signals from one location to, at least, one other location. In this case, telemetry information which is generated at a prior location, (i.e., at the location of modulator 14) or at a specific location (i.e., at the location of optical amplifiers) is used to modulate the amplitude of the data stream passing through the optical amplifier 22, as noted previously, for receipt by optical amplifier 50. Appropriate practical and electronic circuitry can be used to avoid collisions between incoming and outgoing telemetry signals. While the information which is transmitted in the optical data stream is illustrated as being in digital form, it is to be understood that information can be in analog form.

We claim:

1. A semiconductor optical amplifier comprising a bias lead, a DC bias signal source coupled to provide a DC bias signal to the bias lead, means coupled to combine a data signal transmitted to the optical amplifier with an additional amplitude signal, a filter network adapted to block data signals and to pass only the additional amplitude signal, path defining means coupled to pass to said bias lead the DC bias signal from said bias signal source and to pass to the filter network a signal induced on the bias lead by signals amplified by the optical amplifier, and a control network coupled to receive the signal from said filter to generate a control signal and transmit said control signal to the bias signal source to regulate the power generated by the optical amplifier by controlling the value of the DC bias signal generated by the bias signal source.

2. The semiconductor optical amplifier as defined in claim 1 wherein said data signal has a bit rate or frequency which is substantially 1,000 to 100,000 times that of the additional amplitude signal.

3. The semiconductor optical amplifier as defined in claim 2 comprising an amplifier interposed between said filter and said control network and said path defining means comprises a bias tee network.

4. A semiconductor optical amplifier comprising a bias lead, a bias signal source coupled to provide a bias optical signal to the bias lead, means coupled to combine a data bit stream pulse signal transmitted to the optical amplifier with a telemetry signal, path defining means coupled to pass to said bias lead the bias signal from said bias signal source and to pass to a filter network a signal induced on the bias lead by signals amplified by the optical amplifier, and filter means coupled to said filter network to separate induced telemetry signals from other induced signals from transmission to a receiving means.

5. A semiconductor optical amplifier comprising a bias lead, a DC bias signal source coupled to provide a DC bias signal to the bias lead, means coupled to combine a data signal transmitted to the optical amplifier with an additional amplitude signal which includes telemetry information, path defining means coupled to pass to said bias lead the DC bias signal from said bias signal source and to pass to a filter network a signal induced on the bias lead by signals amplified by the optical amplifier, and a control network coupled to receive the signal from said filter to generate a control signal and a telemetry response signal and transmit said control signal and said telemetry response signal to the bias signal source to regulate the power generated by the optical amplifier by controlling the value of the DC bias signal generated by the bias signal source.

* * * * *

UNITED STATES PATENT AND TRADEMARK OFFICE
CERTIFICATE OF CORRECTION

PATENT NO. : 4,918,396
DATED : April 17, 1990
INVENTOR(S) : Thirumala R. Halemane, et. al.

It is certified that error appears in the above-indentified patent and that said Letters Patent is hereby corrected as shown below:

Column 1, line 28, "system" should read -- systems --.

Column 1, line 34, "are" should read -- at --.

Column 3, line 66, "Once" should read -- One --.

Column 5, line 5, "of the characteristic" should read -- of this characteristic --.

Column 5, line 60, "sectio," should read -- section, --.

Column 7, line 13, "optical signal" should read -- signal --.

Column 8, line 1, "from" should read -- for --.

Signed and Sealed this

Twenty-eighth Day of September, 1993

Attest:

BRUCE LEHMAN

*Attesting Officer*    *Commissioner of Patents and Trademarks*